United States Patent
Kasem et al.

(10) Patent No.: US 7,394,150 B2
(45) Date of Patent: Jul. 1, 2008

(54) SEMICONDUCTOR PACKAGE INCLUDING DIE INTERPOSED BETWEEN CUP-SHAPED LEAD FRAME AND LEAD FRAME HAVING MESAS AND VALLEYS

(75) Inventors: Mohammed Kasem, Santa Clara, CA (US); King Owyang, Atherton, CA (US); Frank Kuo, Kaohsiung (TW); Serge Robert Jaunay, Sunnyvale, CA (US); Sen Mao, Kaohsiung (TW); Oscar Ou, Kaohsiung (TW); Peter Wang, Kaohsiung (TW); Chang-Sheng Chen, Santa Clara, CA (US)

(73) Assignee: Siliconix incorporated, Santa Clara, CA (US)

( * ) Notice: Subject to any disclaimer, the term of this patent is extended or adjusted under 35 U.S.C. 154(b) by 138 days.

(21) Appl. No.: 10/996,148

(22) Filed: Nov. 23, 2004

(65) Prior Publication Data

US 2006/0108671 A1 May 25, 2006

(51) Int. Cl.
*H01L 23/52* (2006.01)
*H01L 29/40* (2006.01)
*H01L 21/302* (2006.01)

(52) U.S. Cl. .................. 257/690; 257/691; 257/778; 257/779; 438/661; 174/263

(58) Field of Classification Search ............... 257/690, 257/691, 778, 779; 438/661; 174/263
See application file for complete search history.

(56) References Cited

U.S. PATENT DOCUMENTS 5,098,626 A    3/1992  Pas

| 5,982,041 | A | * | 11/1999 | Mitani et al. | 257/783 |
| 6,027,957 | A | * | 2/2000 | Merritt et al. | 438/106 |
| 6,100,580 | A | * | 8/2000 | Murakami et al. | 257/666 |
| 6,165,819 | A | * | 12/2000 | Seki et al. | 438/123 |

(Continued)

OTHER PUBLICATIONS

International Rectifier Application Note AN-1035 titled "DirectFET Technology" Version 6 dated Aug. 6, 2004 (cover page and pp. 3, 7).

(Continued)

*Primary Examiner*—Howard Weiss
*Assistant Examiner*—Shrinivas Rao
(74) *Attorney, Agent, or Firm*—David E. Steuber

(57) ABSTRACT

A semiconductor package includes a die that is interposed, flip-chip style, between an upper lead frame and a lower lead frame. The lower lead frame has contacts that are aligned with terminals on the bottom surface of the die. The upper lead frame contacts a terminal on the top side of the die, and the edges of the upper lead frame are bent downward around the edges of the die, giving the upper lead frame a cup shape. The edge of the upper lead frame contact another portion of the lower lead frame, so that all of the contacts of the package are coplanar and can be surface-mounted on a printed circuit board. The terminals of the die are electrically connected to the lead frames by means of solder layers. The thicknesses of the respective solder layers that connect the die to the lead frames are predetermined to optimize the performance of the package through numerous thermal cycles. This is done by fabricating the lower lead frame with a plurality of mesas and using a double solder reflow process.

17 Claims, 14 Drawing Sheets

U.S. PATENT DOCUMENTS

| | | | | |
|---|---|---|---|---|
| 6,486,411 | B2 * | 11/2002 | Miura et al. | 174/256 |
| 6,574,861 | B1 * | 6/2003 | Yang et al. | 29/843 |
| 6,580,169 | B2 * | 6/2003 | Sakuyama et al. | 257/738 |
| 6,613,607 | B2 | 9/2003 | Janssen et al. | |
| 6,670,222 | B1 | 12/2003 | Brodsky | 438/118 |
| 6,744,124 | B1 * | 6/2004 | Chang et al. | 257/678 |
| 6,777,788 | B1 | 8/2004 | Wan et al. | 257/670 |
| 6,777,800 | B2 * | 8/2004 | Madrid et al. | 257/690 |
| 6,949,816 | B2 * | 9/2005 | Brown et al. | 257/684 |
| 2003/0051909 | A1 * | 3/2003 | Kim et al. | 174/260 |
| 2003/0052408 | A1 * | 3/2003 | Quinones et al. | 257/737 |
| 2003/0147333 | A1 * | 8/2003 | Tokuda et al. | 369/121 |
| 2004/0016995 | A1 * | 1/2004 | Kuo et al. | 257/678 |
| 2005/0212142 | A1 * | 9/2005 | Miyazaki et al. | 257/779 |
| 2005/0218426 | A1 * | 10/2005 | Kobayashi et al. | 257/177 |
| 2006/0110856 | A1 | 5/2006 | Kasem et al. | 438/123 |

OTHER PUBLICATIONS

International Rectifier Application Note AN-1059 titled "DirectFET Thermal Model and Rating Calculator" by Doug Butchers (4 pages).

* cited by examiner

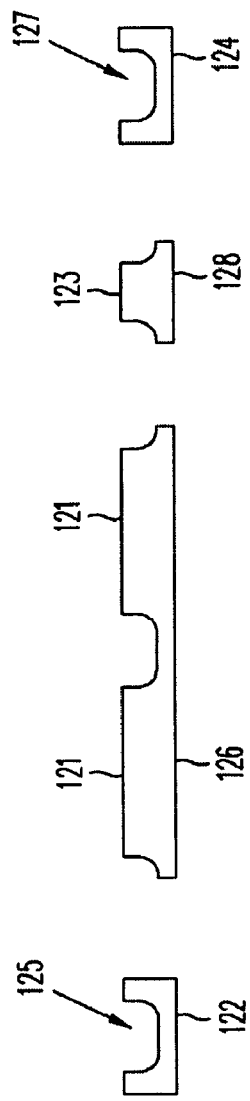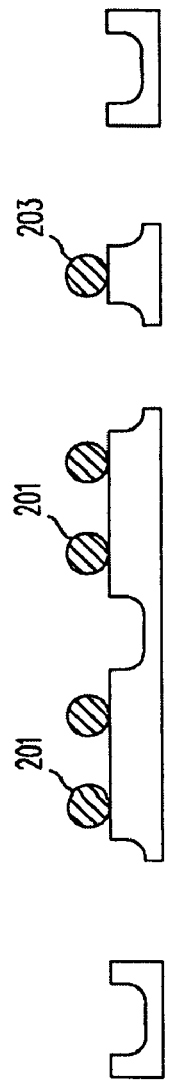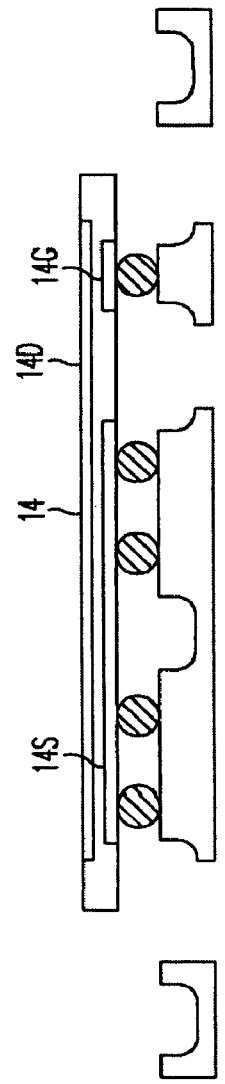
FIG. 11A
FIG. 11B
FIG. 11C

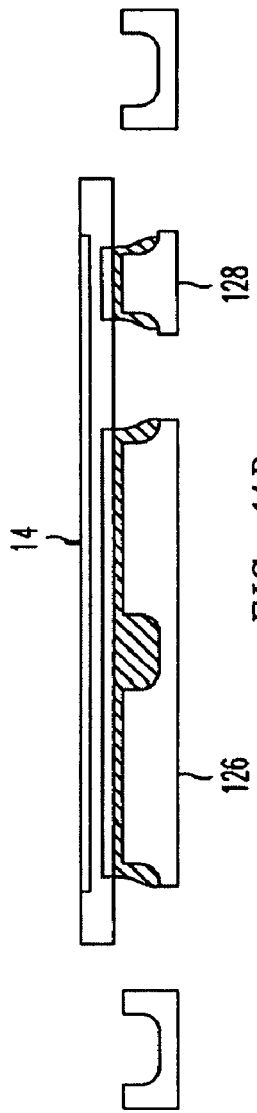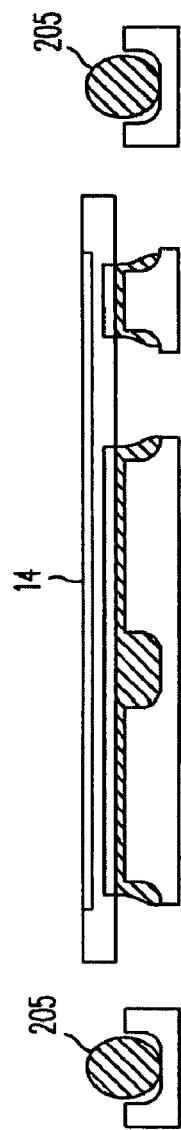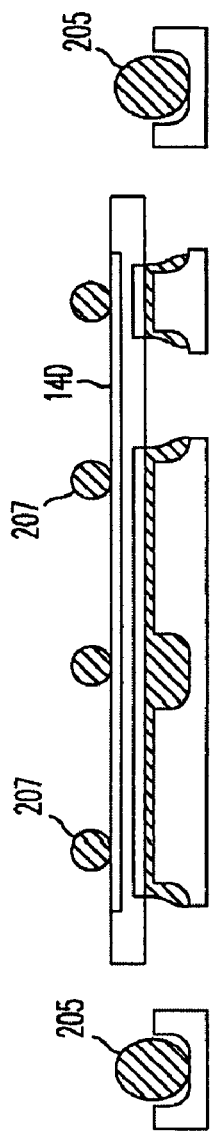

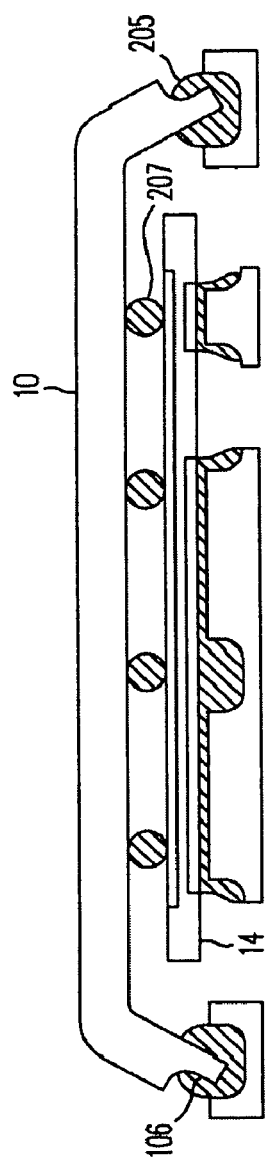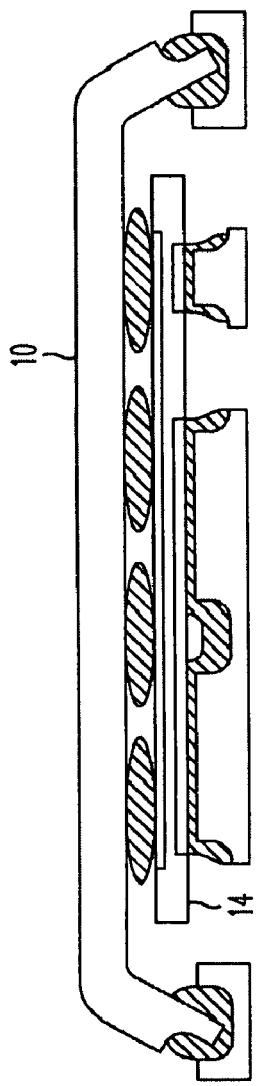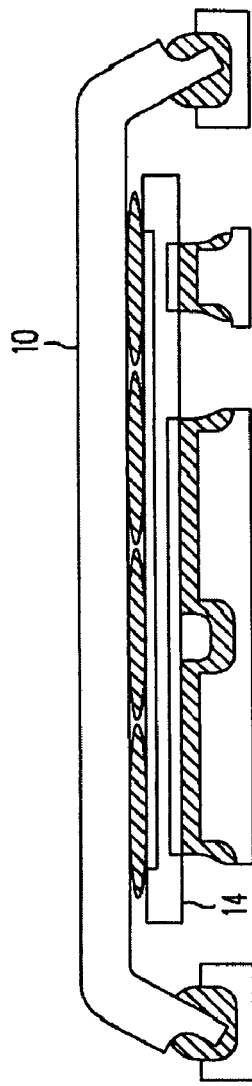

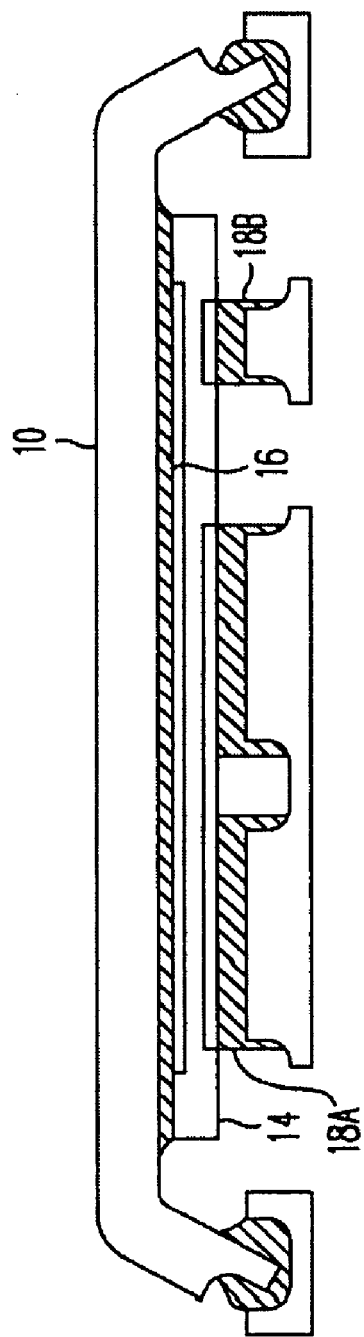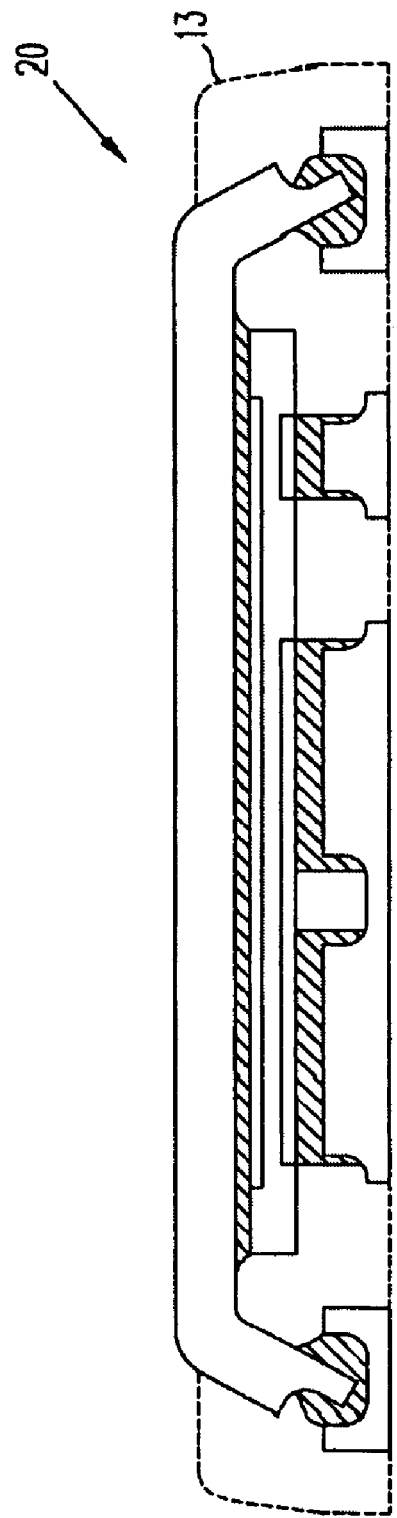

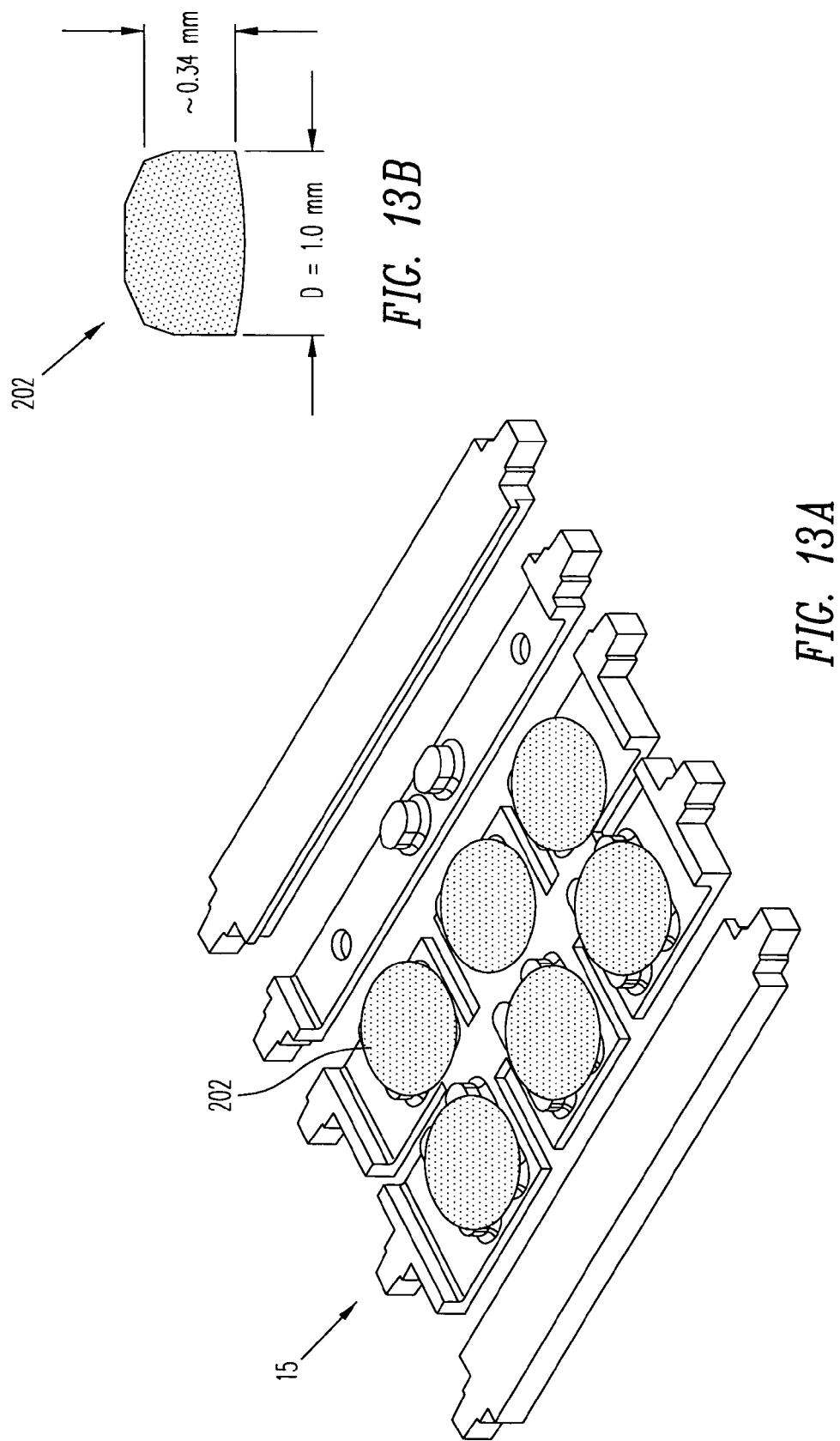

SEMICONDUCTOR PACKAGE INCLUDING DIE INTERPOSED BETWEEN CUP-SHAPED LEAD FRAME AND LEAD FRAME HAVING MESAS AND VALLEYS

FIELD OF THE INVENTION

This invention relates to packages for semiconductor dice and in particular a package for a semiconductor die such as a vertical MOSFET that has terminals on both sides of the die. This application is related to Application No. 10/996,149, filed concurrently herewith, which is incorporated herein by reference in its entirety.

BACKGROUND

There is a continuing need for packages for semiconductor dice that are compact, easy to manufacture and economical. There is a particular need for packages that can be used to make connections to terminals on both sides of the die. For example, vertical power MOSFETs, whether of the planar or trench-gated variety, typically have source and gate terminals on the front side of the die and a drain terminal on the backside of the die. The package must therefore provide connectibility to both sides of the die. Similarly, integrated circuits may need a ground contact to the front side to minimize transient effects.

Vertical trench MOSFETs, in particular, are now widely used in high-end electronic systems such as high-frequency DC-DC converters. These components are used in desktop and notebook computers and servers. In these applications it is critical that the MOSFETs have minimal electrical and thermal resistance.

U.S. Pat. No. 6,744,124 describes a semiconductor die package that has many advantages. The die, for example a trench MOSFET, is mounted in a flip-chip manner inside a cup-shaped lead frame. The drain terminal on the top side of the die is in electrical contact with the cup-shaped lead frame, which has leads that are configured to be coplanar with the bottom surface of the die, on which the source and gate terminals are located.

While the package described in the above-referenced patent has excellent electrical and thermal properties, there is still a need for a package that has even better thermal and electrical characteristics. Moreover, the package should be sufficiently rugged to be able to withstand numerous thermal cycles without failure and the lower surface of the die should be protected from scratching.

SUMMARY

In a semiconductor package according to this invention, a semiconductor die is interposed between an upper lead frame and a lower lead frame. The upper lead frame is cup-shaped and is in electrical contact with a terminal on the top side of the die. The bottom lead frame contains contacts that are in electrical contact with one or more terminals on the bottom of the die. The ends of the upper lead frame are electrically connected to respective contacts which are part of the lower lead frame. The terminals on the bottom of the die are also electrically connected to respective contacts which are part of the lower lead frame.

The lower lead frame includes a series of raised mesas and valleys. The raised mesas are separated by valleys. The terminals on the bottom of the die are connected to the lower lead frame via a layer of solder which generally covers the mesas of the lower lead frame. The ends of the upper lead frame are lodged in cavities in the lower lead frame.

The terminal on the top side of the die is connected to upper lead frame via a layer of solder. The surface of the upper lead frame that faces the die has a plurality of grooves which allow greater compliance between the upper lead frame and the die and thereby minimize cracking of the solder layer and/or the die as the package undergoes thermal cycling. The upper surface of the upper lead frame may be left exposed in the finished package to maximize heat transfer from the package.

According to one aspect of the invention, the relative thickness of the upper solder layer and the lower solder layer are set such that the package is able to undergo numerous thermal cycles without fractures or cracks in either solder layer. Generally, the upper solder layer is thinner than the lower solder layer because the upper solder layer has a wider area of contact between the upper lead frame and the die.

The relative proportions between the thickness of the upper solder layer and the lower solder layer are achieved by a unique double-reflow process. In accordance with this process, drops of a solder paste are first applied to the lower lead frame, typically on the tops of the mesas. The die is then placed onto the solder paste drops, and the solder paste is reflowed. As the solder paste reflows, it forms a solder layer that flows into the valleys of the lower lead frame.

After the solder that connects the die with the lower lead frame has been reflowed, solder paste drops are applied to the top side of the die, and the upper lead frame is placed into position over the die, resting on the solder paste drops on the backside of the die. At the same time or as a separate process step, solder paste is placed on the portions of the lower lead frame that will be contacted by the upper lead frame. Then, a second reflow process is performed. As the solder paste reflows, the die is lifted from the lower lead frame to a position intermediate between the upper and lower lead frames, and solder is drawn from the valleys in the lower lead frame. This lifting of the die occurs as a result of the surface tension of the solder. By regulating the amount of solder paste that is applied to the lower and upper lead frames, respectively, the position of the die between the upper and lower lead frames is optimized.

The resulting package provides excellent electrical and thermal conductivity between the terminals on the top and bottom sides of the die and the upper and lower lead frames, respectively. The contacts for the terminals on the top and bottom sides of the die are located in a single plane, ideal for surface mounting on a printed circuit board or other flat surface. The package can be made very thin and compact and is able to withstand numerous thermal cycles without solder or die cracking.

While the package of this invention is usable with numerous varieties of semiconductor dice, it is particularly suited to vertical power MOSFETs, wherein the drain terminal is typically on the top side (backside) of the die and the source and gate terminals are on the bottom (front side) of the die.

BRIEF DESCRIPTION OF THE DRAWINGS

FIGS. 11A-11K illustrate the steps of a process of fabricating a semiconductor package of this invention.

FIGS. 13A and 13B illustrate the pattern and size of solder paste drops that may be placed on the source contact of the lower lead frame shown in FIG. 8 to provide an acceptable lower solder layer.

DETAILED DESCRIPTION

Figure 1A:
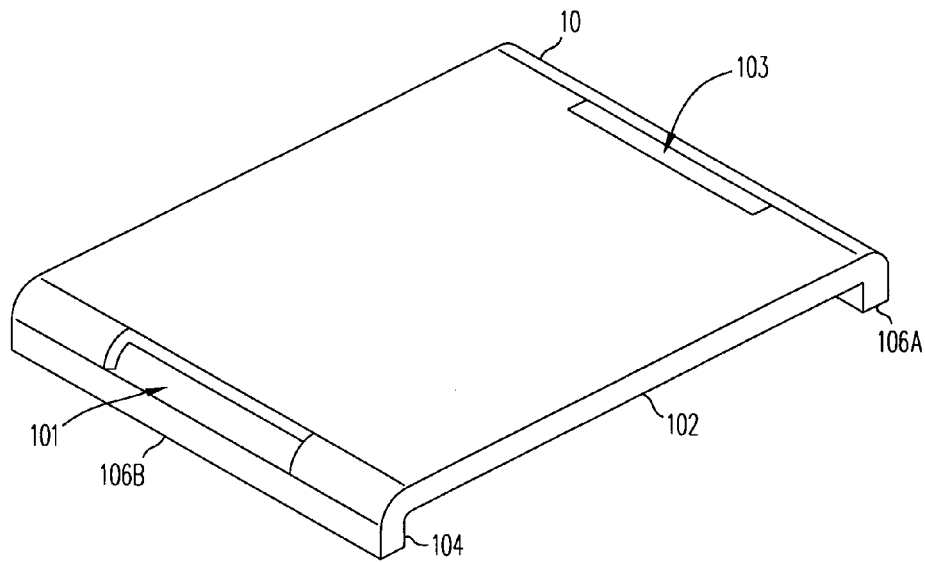
FIG. 1A is a perspective view of the upper lead frame.
Figure 2:
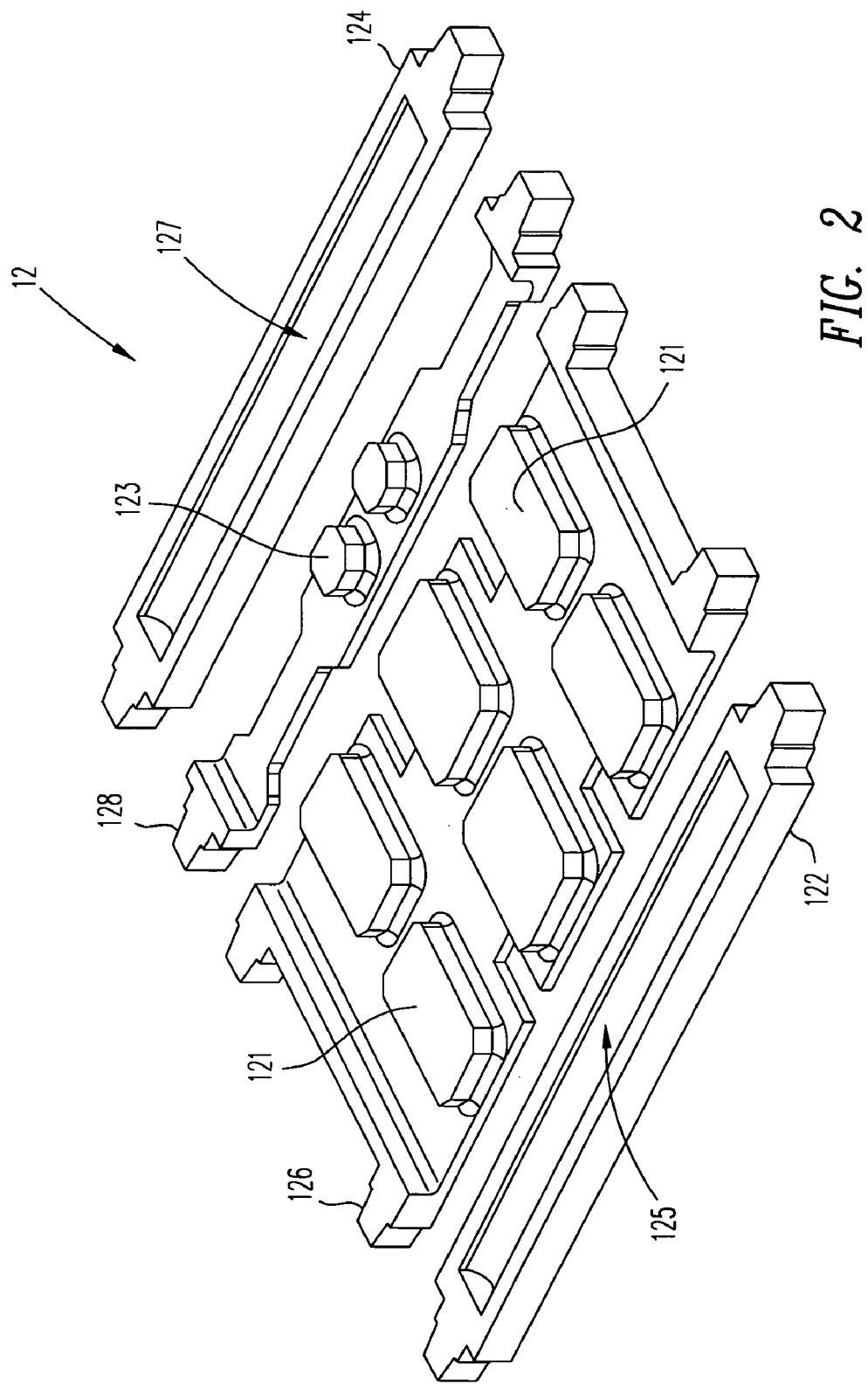
FIG. 2 is a perspective view of the lower lead frame.

FIGS. 1A and 2 are perspective views of an upper lead frame 10 and a lower lead frame 12 in accordance with this invention. Upper lead frame 10 is cup-shaped, with a relatively flat central portion 102 and downward-bent side portions 104 that terminate in feet 106A and 106B. Lower lead frame 12, which is shown after the tie bars (not shown) have been severed, includes four components, drain contacts 122 and 124, a source contact 126, and a gate contact 128. Longitudinal openings 101 and 103 are formed in upper lead frame 10 at the locations where the sheet metal is bent to form side portion 104.

Upper lead frame 10 and lower lead frame 12 can be made of a copper alloy sheet that is 0.006" to 0.012" thick. The copper alloy may be alloy 194. As indicated, lower lead frame 12 has been partially etched to form a plurality of raised mesas 121 on source contact 126 and a plurality of raised mesas 123 on gate contact 128. Also, the etching process is used to form longitudinal cavities 125 and 127 in drain contacts 122 and 124, respectively. Mesas 121 and 123 and cavities 125 and 127 can be formed by etching the copper alloy of lower lead frame 12 with a chemical solution to a thickness about one-half of its original thickness. Alternatively, mesas 121 and 123 and cavities 125 and 127 may be formed by progressive stamping.

Figure 1B:
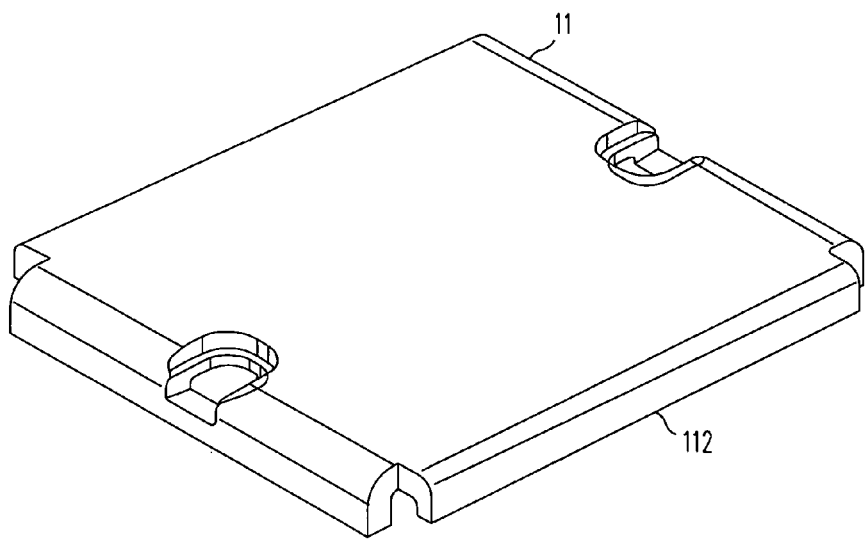
FIG. 1B is a perspective view of an alternative embodiment of the upper lead frame.

FIG. 1B is a perspective view of an alternative form of upper lead frame 11, which has side walls 112

Figure 3:
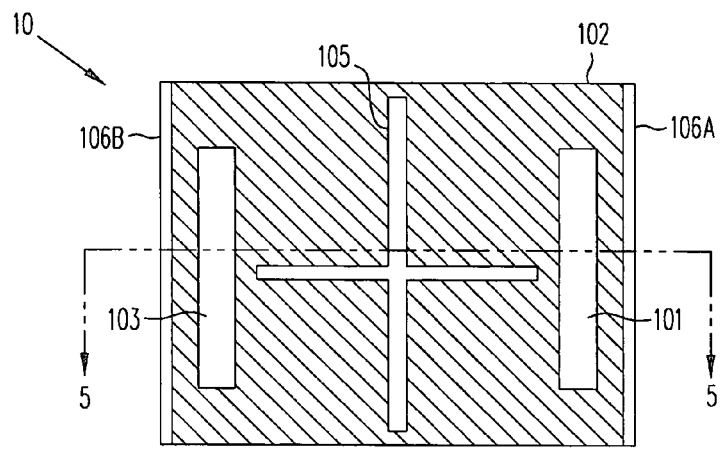
FIG. 3 is a view of the upper lead frame from below.
Figure 4:
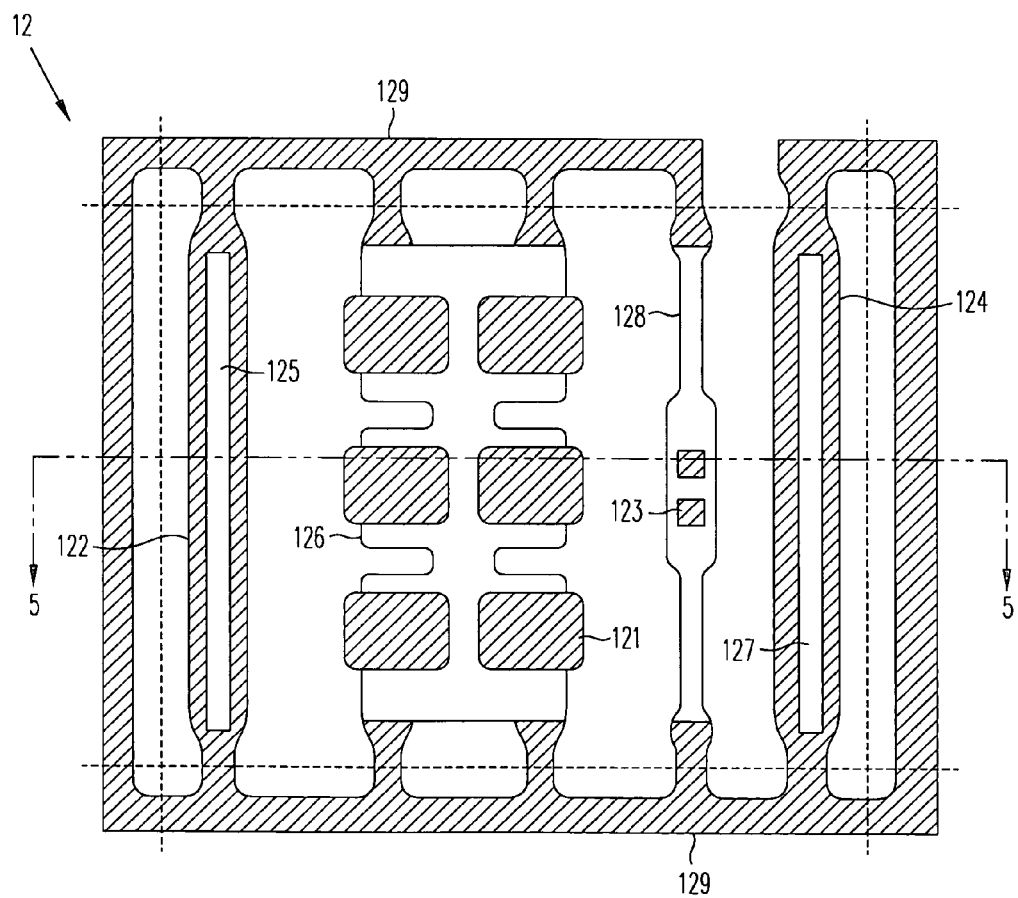
FIG. 4 is a plan view of the lower lead frame from above.
Figure 12B:
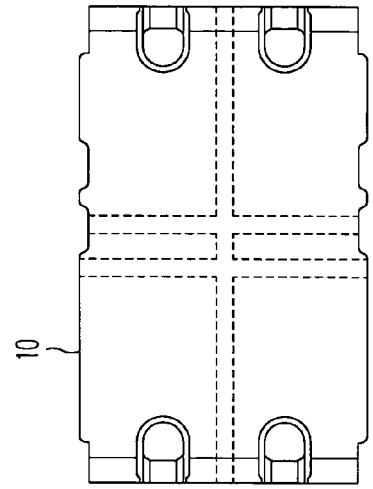
FIGS. 12A-12D illustrate several patterns of grooves that may be formed on the underside of upper lead frame.
Figure 12D:
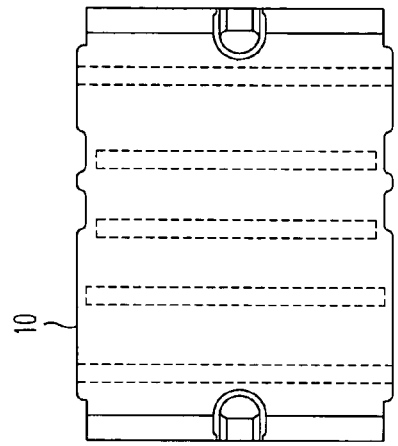
Figure 12A:
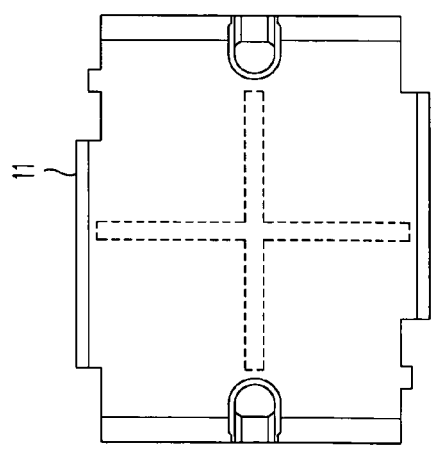
Figure 12C:
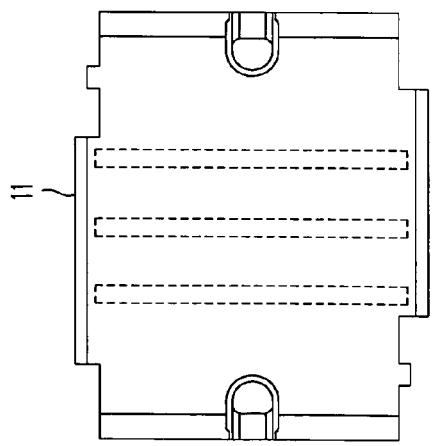

FIGS. 3 and 4 illustrate views of the underside of upper lead frame 10 and the top side of lower lead frame 12, respectively. As shown in FIG. 3, a cross-shaped groove 105 is formed by partially etching the lower surface of upper lead frame 10. As described below, groove 105 improves the compliance of upper lead frame 10 with a semiconductor die during thermal cycles. Groove 105 reduces the accumulation of stress during thermal cycles. Groove 105 can be formed by etching upper lead frame 10 to a thickness of 0.002" to 0.006". FIGS. 12A to 12D illustrate several patterns of grooves that may be formed on the underside of upper lead frames 10 and 11, including a single cross (FIG. 12A), a double cross (FIG. 12B), and a series of parallel grooves (FIGS. 12C and 12D). However, it has been found that forming too many grooves in upper lead frame 10 reduces the strength of the lead frame and increases the risk of die cracking during the molding process. During the molding process the flat central portion 102 of the upper lead frame 10 protects the die from differential forces that might crack it.

FIG. 4 shows a top view of lower lead frame 12 before the tie bars 129 have been severed. Of course, it will be understood by those skilled in the art that lead frame 12 is normally only a single panel in an array of panels each of which will form a single package and all of which are processed simultaneously. The orthogonal dashed lines indicate where lower lead frame 12 will be severed by a dicing saw or punch tool when the packages are singulated. The hatched areas represent the unetched portions of lower lead frame 12; the open areas represent the areas that are etched to form mesas 121 and 123 and cavities 125 and 127.

Figure 5:
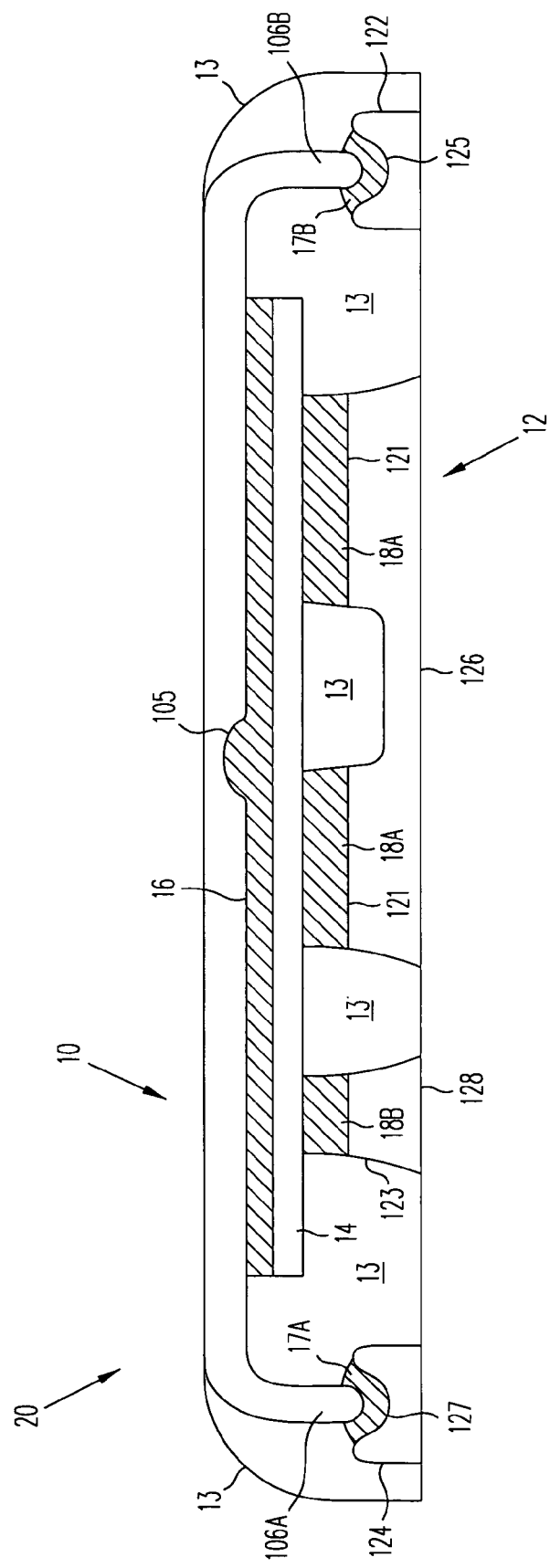
FIG. 5 is a cross-sectional view of a semiconductor package in accordance with this invention.

FIG. 5 shows a cross-sectional view of a semiconductor package 20 which contains upper lead frame 10 and lower lead frame 12. FIG. 5 is taken at the section line 5-5 shown in FIGS. 3 and 4. Package 20 includes a semiconductor die 14 which is interposed between upper lead frame 10 and lower lead frame 12. In this embodiment semiconductor die 14 contains a vertical trench MOSFET with a drain terminal (not shown) on the top surface of die 14 and source and gate terminals (not shown) on the lower surface of die 14.

The drain terminal on the top surface of die 14 is electrically and thermally connected to upper lead frame 10 by an upper solder layer 16, which as shown extends into groove 105 on the bottom surface of upper lead frame 10. Foot 106A of upper lead frame 10 extends into cavity 127 of drain contact 124 and makes electrical and thermal contact with drain contact 124 via a solder layer 17A. Similarly, foot 106B of upper lead frame 10 extends into cavity 125 of drain contact 122 and makes electrical and thermal contact with drain contact 122 via a solder layer 17B. As described below, solder layers 17A and 17B may be deposited at the same time. In some embodiments cavities 125 and 127 may be omitted in the drain contacts.

Referring again to the bottom surface of die 14, the source terminal (not shown) is electrically and thermally connected to source contact 126 via a solder layer 18A, which extends from top surfaces of the mesas 121 to the source terminal of die 14. Similarly, the gate terminal of die 14 (not shown) is electrically and thermally connected to gate contact 128 via a solder layer 18B, which extends from top surfaces of the mesas 123 to the gate terminal of die 14. As described below, Solder layers 18A and 18B may be deposited at the same time as a lower solder layer 18.

The remaining areas of package 20 are filled with a molding compound, which is typically a plastic such as Nitto 8000CH4, and which forms a protective capsule for die 14 and other components of package 20. Note in particular that the molding compound 13 fills the area between mesas 121 over the source contact 126.

As indicated in FIG. 5, the lower solder layer 18 is generally thicker than the upper solder layer 16. Therefore, lower solder layer 18 is more rugged and is better able to withstand differential lateral expansion between die 14 and the elements of lower lead frame 12. On the other hand, upper solder layer 16 has a wider area of contact between die 14 and upper lead frame 10. This increases the strength of upper solder layer 16 and consequently upper solder layer 16 does not need to be as rugged as lower solder layer 18. In addition, the cross groove 105 that is formed in upper lead frame 10 reduces the lateral stress that upper lead frame 10 imposes on upper solder layer 16, and this also lessens the tendency of upper solder layer 16 to crack or fracture as package 20 experiences repeated thermal cycles. Typically, the ratio of the thickness between upper solder layer 16 and lower solder layer 18 is in the range of 1:10 to 1:2. For example, in one embodiment the upper solder layer 16 was 1.1 mils thick and the lower solder layer 18 was 2.8 mils thick. In another embodiment, the upper solder layer 16 was 0.4 mils thick and the lower solder layer 18 was 3.0 mils thick. Generally, where satisfactory results have been obtained, the lower solder layer is greater than 2.0 mils thick and the upper solder layer is less than 1.2 mils thick.

Figure 6:
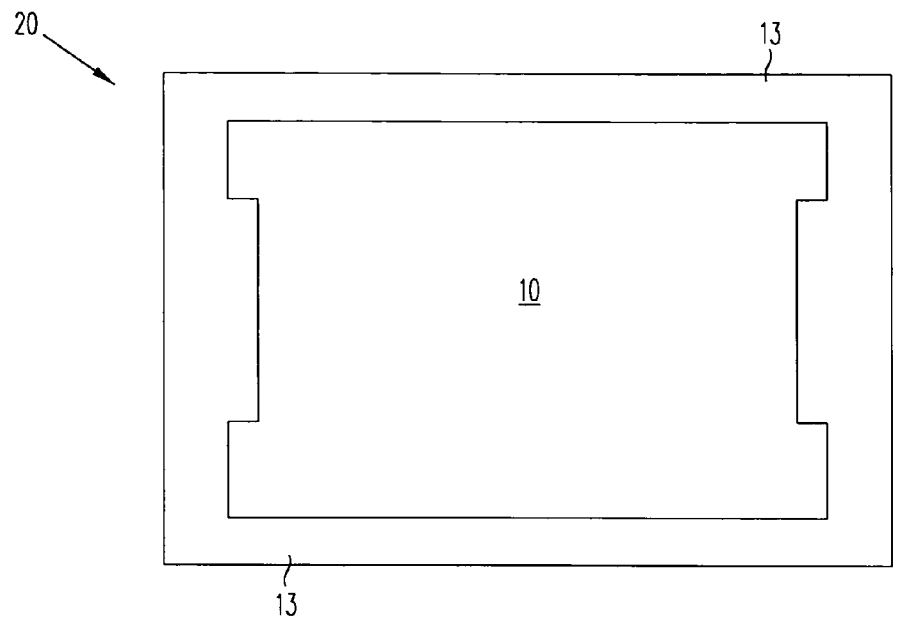
FIG. 6 is a view of the semiconductor package from above.
Figure 7:
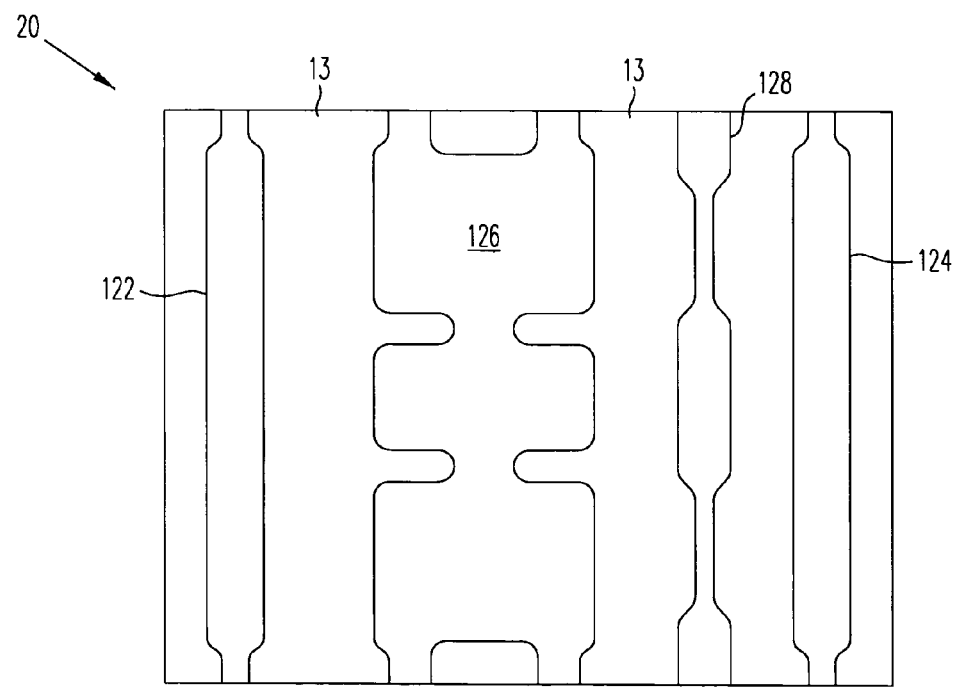
FIG. 7 is a view of the semiconductor package from below.

FIGS. 6 and 7 show top and bottom views, respectively, of semiconductor package 20. Note with respect to FIG. 6 that the top surface of upper lead frame 10 is left exposed to improve the ability of package 20 to transfer heat from die 14 to the external environment (e.g., atmosphere).

Figure 8:
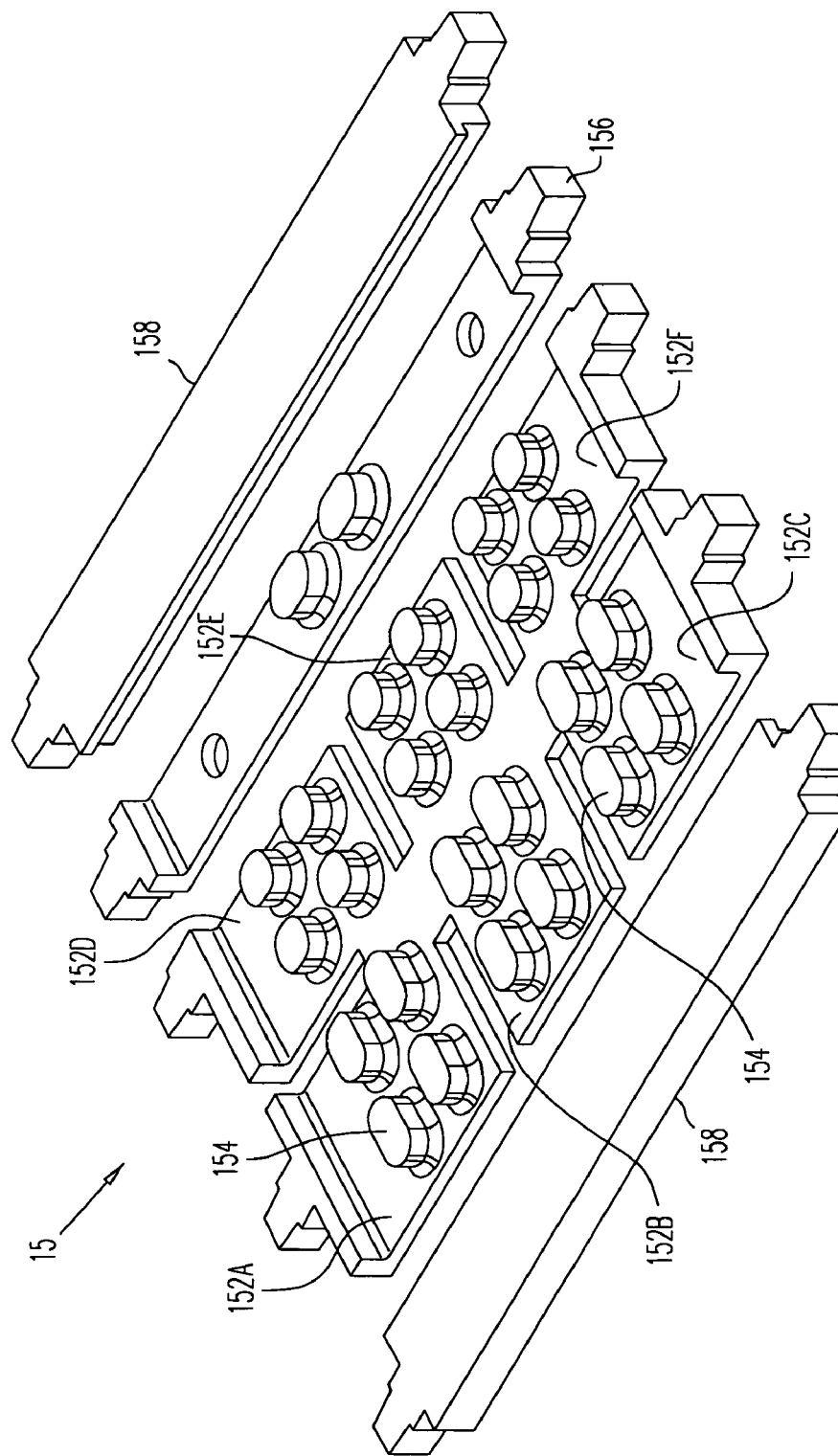
FIG. 8 is a perspective view of an alternative form of lower lead frame.

Different patterns of raised mesas may be formed on the lower lead frame. For example, FIG. 8 illustrates a bottom view of a lower lead frame 15 wherein the source contact 152 is divided into six paddle-like sections 152A-152F, which are separated by slots formed in source contact 152. Each of sections 152A-152F has four raised mesas 154. Gate contact 156 and drain contacts 158 are similar to the gate and drain contacts in lower lead frame 12, shown in FIG. 4.

Preferably a silicone-based die coating is applied to the passivation layer of the die to help prevent cracking of the passivation layer. One die coating that has been found acceptable is Dow Corning HIPEC Q1-4939. Packages having a lower lead frame of the kind shown in FIG. 8 along with a die coating have survived 1000 thermal cycles from −65° C. to +150° C. with no die, solder or passivation cracking.

FIGS. 11A-11K illustrate a process of fabricating the semiconductor package 20 shown in FIG. 5. Note that FIGS. 11A-11K are schematic and not drawn to scale.

As shown in FIG. 11A, the process begins with lower lead frame 12, which is formed in a conventional manner (typically by stamping). Lower lead frame 12 is then partially etched, preferably using the process described above, to form mesas 121 on source contact 126, mesas 123 on gate contact 128, cavity 125 in drain contact 122, and cavity 127 in drain contact 124.

As shown in FIG. 11B, solder paste drops 201 are dispensed on the top surfaces of mesas 121 and solder paste drops 203 are dispensed on the top surfaces of mesas 123. As described below, the volume of drops 201 and 203 is set to help assure the correct thickness of the upper and lower solder layers in the finished package. FIG. 13A shows a pattern of solder paste drops 202 that are placed on the mesas 154 of the lead frame 15, illustrated in FIG. 8. As shown in FIG. 13B, the diameter of each of solder paste drops 202 is 1.0 mm and the height of each of solder paste drops 202 is 0.34 mm, yielding a volume of 0.00027 cc. Since there are a total of six drops 202 on the source contact of lead frame 15, the combined volume of the solder paste drops 202 is about 0.00162 cc. When the process is completed, as described below, this produces a lower solder layer having a thickness of 3.5 mils.

Next, as shown in FIG. 11C, semiconductor die 14 is placed onto solder paste drops 201 and 203, with source terminal 14S in contact with drops 201 and gate terminal in contact with drops 203.

Figure 9:
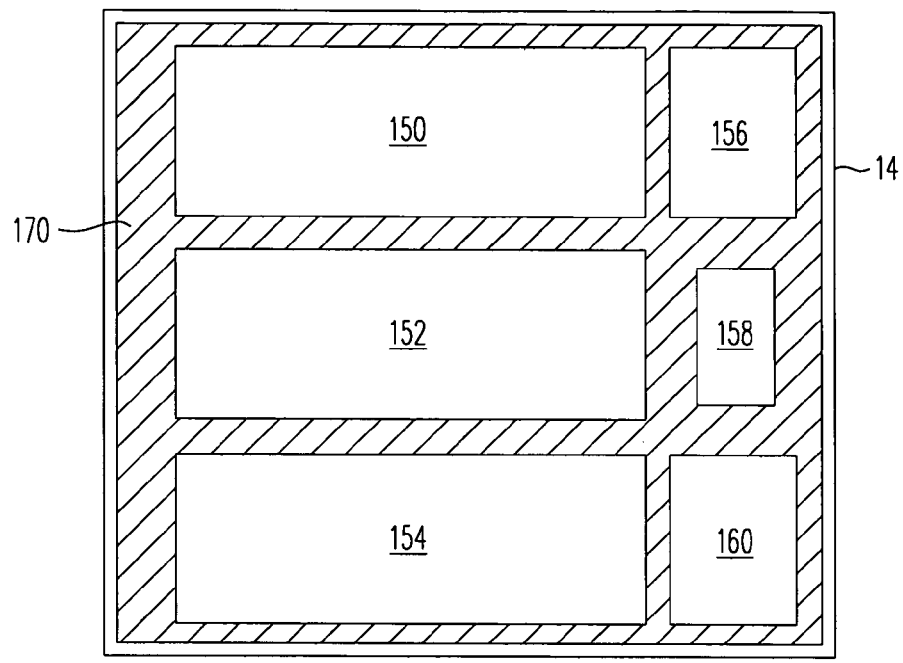
FIG. 9 is a view of the semiconductor die from below.

The solder paste is then reflowed by heating it. This first reflow causes the solder to flow into the valleys between and around the mesas 121 and 123, and die 14 settles downward towards source contact 126 and gate contact 128. The result is shown in FIG. 11D. It is preferable to restrict the reflowing solder to defined areas of the die, since in the finished package a large, laterally expansive solder layer between lower lead frame 12 and die 14 tends to impose a greater stress on the solder layer and the die. Therefore, it is desirable to structure the die 14 as shown in FIG. 9, with segregated source and gate pads, each of which is surrounded by a passivation layer. FIG. 9 is a view of the front side of die 14. The source terminal is separated into separate source pads 150,152, 154,156, 160, and gate pad 158 is connected to the gate terminal. As the solder paste drops melt, the passivation layer 170 acts as a barrier that prevents the solder from flowing from one pad to another.

Figure 14B:
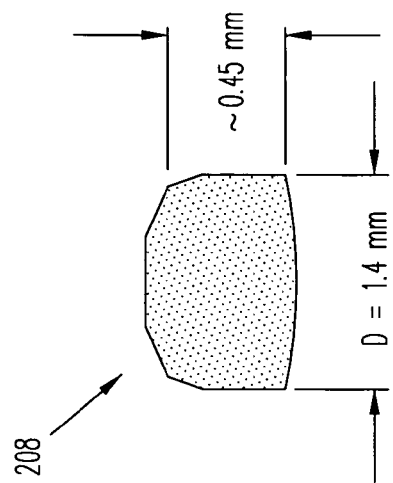
FIGS. 14A and 14B illustrate the pattern and size of solder paste drops that may be placed on the backside of the die to provide an acceptable upper solder layer.
Figure 14A:
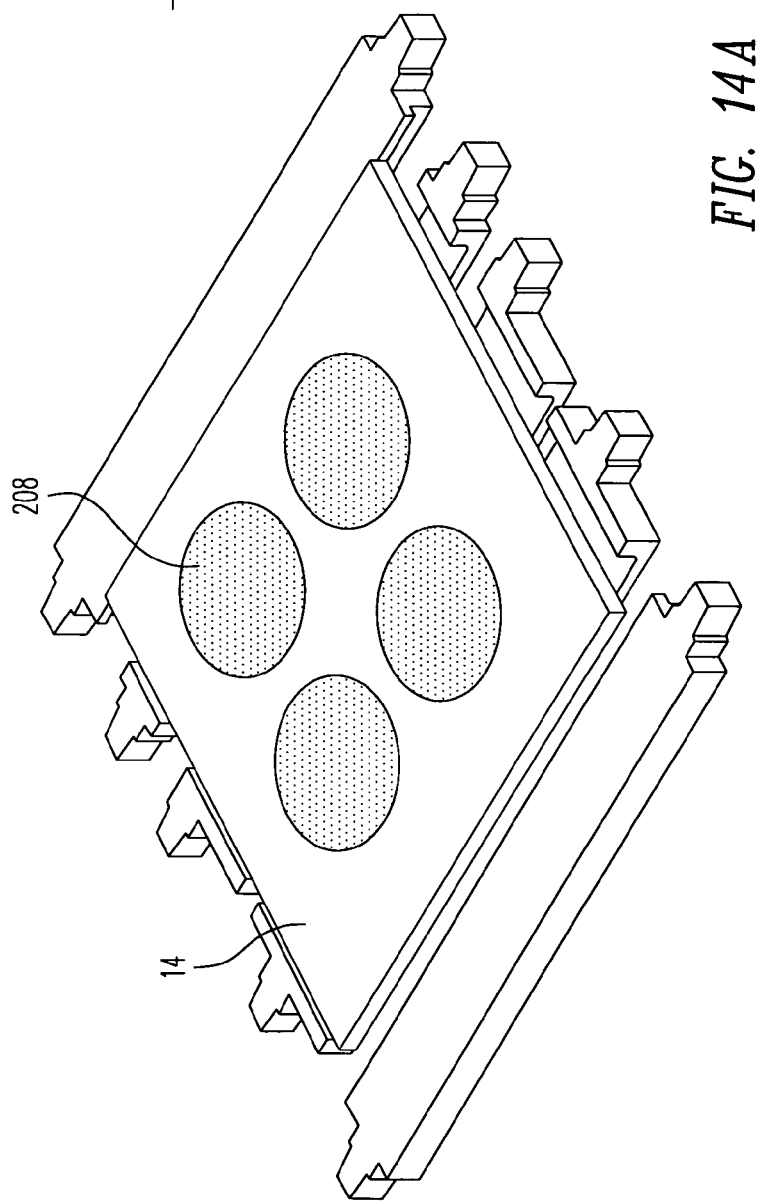

As shown in FIG. 11E, solder paste drops 205 are then dispensed in cavities 125 and 127 and, as shown in FIG. 11 F, solder paste drops 207 are dispensed on the backside of die 14, in contact with the drain terminal 14D. Alternatively, solder paste drops 207 can be deposited in the same step as solder paste drops 205. The size of solder paste drops 207 is set at the correct level in relationship to the size of solder paste drops 201 and 203, to provide the desired thicknesses of the upper and lower solder layers in the finished package. FIG. 14A shows an alternative pattern of solder paste drops 208 that may be placed on the backside of die 14. As shown in FIG. 14B, the diameter of each of solder paste drops 208 is 1.4 mm and the height of each of solder paste drops 208 is 0.45 mm, yielding a volume of 0.00068 cc. Since there are a total of four drops 208 on the backside of die 14, the combined volume of the solder paste drops 208 is about 0.0027 cc. When the process is completed, as described below, this produces an upper solder layer having a thickness of 0.8 mil.

As shown in FIG. 11G, upper lead frame 10 is placed on top of solder paste drops 205 and 207, with feet 106 in contact with solder paste drops 205.

Next, a second reflow process is carried out. In the second reflow process, solder paste drops 205 and 207 melt, causing upper lead frame 10 initially to settle towards die 14. As the solder continues to melt, however, the surface tension of the resulting liquid solder tends to pull die 14 upward towards upper lead frame 10. This lifts die 14 away from lower lead frame 12. As a result, the solder between die 14 and source contact 126 is drawn out of the valleys between mesas 121 and onto the top surfaces of the mesas 121. Successive stages of this process are shown in FIGS. 11H to 11J. FIGS. 11H and 11I illustrate the flattening of the solder paste drops 207, and FIG. 11J illustrates the formation of upper solder layer 16 and lower solder layers 18A and 18B. Because of the surface tension in the upper solder layer 16, die 14 is suspended at a desired position between upper lead frame 10 and lower lead frame 12. As indicated above, the actual location of die 14 is primarily determined by the respective sizes of solder paste drops 201 and 207 (and to a lesser degree the sizes of solder paste drops 203). Through a trial-and-error process, those of skill in the art will be able to adjust the sizes of the solder paste drops to produce upper and lower solder layers having the desired thicknesses.

Finally, the structure is processed in transfer molding equipment and the tie bars are severed to produce semiconductor package 20, shown in FIG. 11K. Preferably, a Boschman Flexstar 3020 Molding System is used to perform the molding and a Disco DAD341 saw machine is used to separate the packages. Techniques described in U.S. Pat. Nos. 5,098,626 and 6,613,607, each of which is incorporated herein by reference in its entirety, may be used to advantage. It has been found useful to modify the Boschman equipment by substituting an insert that has a flat lower surface instead of a lower surface that has a cavity. The lower surface of the insert contacts the top surface of the upper lead frame (through a seal film) and it has been found that eliminating the cavity reduces the tendency of the die to crack under the pressure of the insert.

Figure 10:
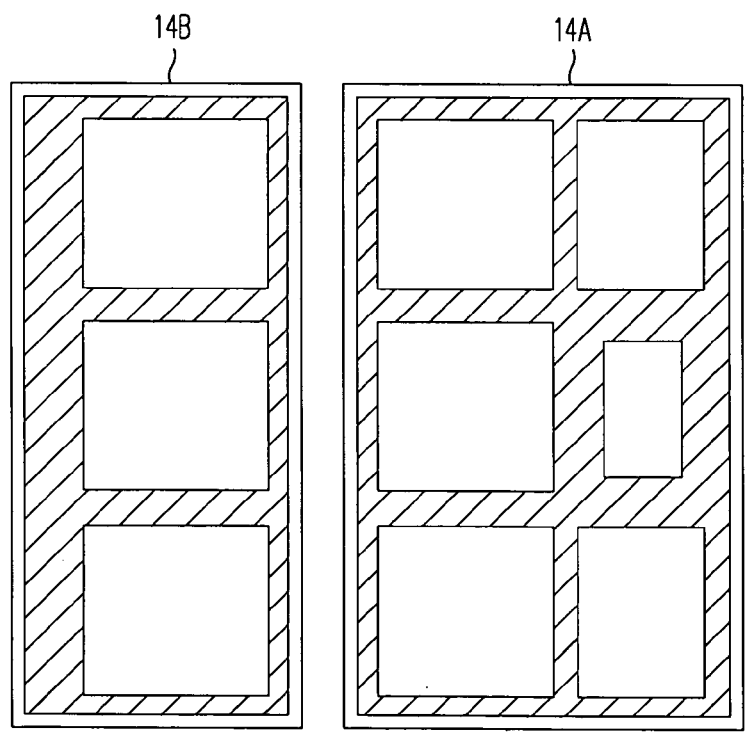
FIG. 10 is a view of an small active die and a dummy die that can be substituted in the package for a single larger active die.

The semiconductor package described herein is extremely efficient and rugged and can be adapted to various die sizes. For example, a "dummy" die may be mounted inside the package if the active die is too small to be mounted by itself. For example, as shown in FIG. 10, if the active die 14A is too small is to be mounted in package 20, a dummy die 14B can be mounted next to die 14A so that both dice 14A and 14B occupy essentially the same space as die 14 shown in FIG. 5.

Although the present invention is illustrated in connection with specific embodiments for instructional purposes, the present invention is not limited thereto. Various adaptations and modifications may be made without departing from the scope of the invention. Therefore, the spirit and scope of the appended claims should not be limited to the foregoing description.

We claim:

1. A semiconductor package comprising:
   a semiconductor die having a first terminal on a top surface of said die and at least a second terminal on a bottom surface of said die;
   an upper lead frame in electrical contact with said first terminal, said upper lead frame having bent portions extending downward around a pair of opposite edges of said semiconductor die, each of said bent portions terminating in a foot;
   a lower lead frame comprising at least two contacts, a first one of said contacts having a plurality of raised mesas formed in a top surface of said first contact, said mesas being separated by valleys;
   a first solder layer connecting said first terminal of said die to said upper lead frame;
   a second solder layer connecting said second terminal of said die to said first contact of said lower lead frame.

2. The semiconductor package of claim 1 wherein said second solder layer is thicker than said first solder layer.

3. The semiconductor package of claim 1 wherein a groove is formed in a lower surface of said upper lead frame.

4. The semiconductor package of claim 3 wherein said groove is formed in the shape of a cross on said lower surface of said upper lead frame.

5. The semiconductor package of claim 3 wherein said first solder layer extends into said groove.

6. The semiconductor package of claim 1 wherein said second solder layer covers a top surface of each of said mesas.

7. The semiconductor package of claim 1 comprising a third solder layer connecting said upper lead frame to a second one of said contacts of said lower lead frame.

8. The semiconductor package of claim 7 wherein said second one of said contacts has a cavity formed in a top surface thereof.

9. The semiconductor package of claim 1 comprising a protective capsule formed of a molding compound, said molding compounding separating said at least two contacts.

10. The semiconductor package of claim 9 wherein said valleys contain said molding compound.

11. The semiconductor package of claim 1 wherein a passivation layer overlies a portion of said die.

12. The semiconductor package of claim 1 wherein said upper lead frame comprises a pair of sidewalls that extend downward over a second pair of opposite edges of said die.

13. A package for a vertical MOSFET, said package comprising:
    a semiconductor die containing said vertical MOSFET, said die having a drain terminal on a top surface of said die and a source terminal and a gate terminal on a bottom surface of said die;
    an upper lead frame in electrical contact with said drain terminal, said upper lead frame having bent portions extending downward around opposite edges of said semiconductor die, each of said bent portions terminating in a foot;
    a lower lead frame comprising a source contact, a gate contact, and a pair of drain contacts, each of said source contact and said gate contact having at least two raised mesas formed in a top surface thereof, said at least two raised mesas separated by a valley, said source, gate and drain contacts having coplanar bottom surfaces;
    a first solder layer connecting said drain terminal to said upper lead frame;
    a second solder layer connecting said source terminal to said source contact;
    a third solder layer connecting said gate terminal to said gate contact; and
    a protective capsule formed of a molding compound, portions of said molding compound separating said first and second contacts.

14. The package of claim 13 wherein said source contact comprises a plurality of paddle-like sections separated by slots, each of said paddle sections comprising a plurality of said raised mesas.

15. The semiconductor package of claim 6 wherein said second solder layer does not extend into said valleys.

16. The semiconductor package of claim 13 wherein said second solder layer covers a top surface of each of said at least two mesas.

17. The semiconductor package of claim 16 wherein said second solder layer does not extend into said valley.

* * * * *